US006847272B2

(12) United States Patent
Yip et al.

(10) Patent No.: US 6,847,272 B2
(45) Date of Patent: Jan. 25, 2005

(54) WEIGHTED SAW REFLECTOR USING DISTRIBUTED ACOUSTIC REFLECTIVE DOTS

(75) Inventors: Davis S. Yip, La Mirada, CA (US); Edward M. Garber, Los Angeles, CA (US); Alvin M. Kong, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 40 days.

(21) Appl. No.: 10/376,802

(22) Filed: Feb. 28, 2003

(65) Prior Publication Data

US 2004/0169568 A1 Sep. 2, 2004

(51) Int. Cl.[7] .............................. H03H 9/25; H03H 9/64
(52) U.S. Cl. .................................. 333/195; 310/313 D
(58) Field of Search ................................ 333/193–196; 310/313 B, 313 D

(56) References Cited

U.S. PATENT DOCUMENTS

| | | | | |
|---|---|---|---|---|
| 4,055,820 A | * | 10/1977 | Solie ........................... | 333/153 |
| 4,155,056 A | * | 5/1979 | Cross et al. ................. | 333/195 |
| 4,267,534 A | * | 5/1981 | Tanski ......................... | 333/153 |
| 4,281,301 A | | 7/1981 | Stevens et al. ............. | 333/195 |
| 4,340,834 A | * | 7/1982 | Sato ........................ | 310/313 D |
| 4,623,855 A | * | 11/1986 | Bulst .......................... | 333/195 |
| 4,760,360 A | * | 7/1988 | Grassl et al. ................ | 333/195 |
| 4,878,036 A | * | 10/1989 | Yatsuda et al. ............. | 333/195 |
| 5,289,073 A | * | 2/1994 | Mariani ................... | 310/313 D |
| 5,351,022 A | * | 9/1994 | Ruile et al. ................. | 333/195 |
| 5,379,010 A | * | 1/1995 | Ruile et al. ................. | 333/195 |
| 5,382,930 A | | 1/1995 | Stokes et al. ............... | 333/191 |
| 5,406,159 A | | 4/1995 | Wright ................... | 310/313 D |
| 5,475,348 A | | 12/1995 | Hode et al. ................. | 333/195 |
| 5,552,655 A | | 9/1996 | Stokes et al. ............... | 310/330 |
| 5,621,364 A | | 4/1997 | Ruile et al. ................. | 333/195 |
| 5,661,444 A | | 8/1997 | Dill et al. ................... | 333/195 |
| 5,896,072 A | | 4/1999 | Bergmann et al. .......... | 333/195 |
| 6,104,260 A | | 8/2000 | Yamada et al. ............. | 333/193 |
| 6,278,219 B1 | * | 8/2001 | Kaneda et al. .......... | 310/313 D |

FOREIGN PATENT DOCUMENTS

| | | | | |
|---|---|---|---|---|
| DE | 42 113 117 A1 | | 10/1993 | |
| EP | 0 614 272 A | | 9/1994 | |
| EP | 1 003 286 A2 | | 5/2000 | |
| JP | 54-100238 | * | 8/1979 | ............. 310/313 D |
| JP | 62-42607 | * | 2/1987 | ................. 333/193 |
| JP | 2001-156577 | * | 6/2001 | |

OTHER PUBLICATIONS

Dill, R. et al., A Novel SAW Filter for IF–Filtering in DECT Systems:, Ultrasonics Symposium, 1995 IEEE. Proceedings., 1995 IEEE, Seattle, WA, USA, Nov. 7–10, 1995, New York, NY, USA, IEEE, US, Nov. 7, 1995, pp. 51–54.

Woods, R.C., "Dispersive Delay Lines Using 180 degrees Reflecting Metal Dot Arrays", Ultrasonics Symposium Proceedings, San Diego, CA, USA, vol. 1, Oct. 29, 1982, pp. 88–91, New York, NY.

Riha, G., et al., "RAC–Filters with Position Weighted Metallic Strip Arrays", Proceedings of the Ultrasonics Symposium, San Diego, CA, USA, Oct. 27–19, 1982, vol. 1, Oct. 29, 1982, pp. 83–87.

Tanski, W., Block, M., and Vulcan, A., "High Performance Saw Resonator Filters for Satellite Use", 1980 Ultrasonics Symposium, 1980 IEEE, pp. 148–152.

* cited by examiner

*Primary Examiner*—Barbara Summons
(74) *Attorney, Agent, or Firm*—John A. Miller; Warn, Hoffmann, Miller & LaLone, P.C.

(57) ABSTRACT

A reflective grating (18) having spaced grid lines (36) patterned on a piezoelectric substrate (12) for controlling the magnitude and phase of surface acoustic waves (28) in a reflective filter (10) or resonator. The magnitude and phase of the surface acoustic wave (28) are controlled by a sampling period (34) of the reflective grating (18) and the density and sequence of distributed acoustic reflective dots (42). The reflective dots (42) are randomly distributed within gaps (40) between adjacent grid lines (36) or on top of the grid lines (36) of the reflective grating (18). The pattern of the reflective dots distributed within the gaps (40) or on the grid lines (36) is determined by the dot density, where the dot density varies from a lowest density of 0 to a maximum density of 1.

29 Claims, 7 Drawing Sheets

WEIGHTED SAW REFLECTOR USING DISTRIBUTED ACOUSTIC REFLECTIVE DOTS

BACKGROUND OF THE INVENTION

1. Field of the Invention

This invention relates generally to weighted surface acoustic wave reflectors for use in a SAW filter or SAW resonator and, more particularly, to weighted surface acoustic wave reflectors that employ grid lines having randomly distributed acoustic reflective dots within gaps between adjacent grid lines, on the grid lines or on or between non-periodically spaced grid lines to provide the desired net reflectivity.

2. Discussion of the Related Art

Surface acoustic wave (SAW) filters for use in mobile phone communications systems are designed to be small in size, exhibit good out-of-band rejection, and provide narrow bandwidths with steep transition edges. Conventional SAW filters include an input transducer and an output transducer formed on a piezoelectric substrate. The input transducer is electrically excited with the electrical input signal that is to be filtered. The input transducer converts the electrical input signal to surface acoustic waves, such as Rayleigh waves, lamb waves, etc., that propagate along the substrate to the output transducer. The output transducer converts the acoustic waves to a filtered electrical signal.

The input and output transducers typically include interdigital electrodes formed on the top surface of the substrate. The shape and spacing of the electrodes determines the center frequency and the band shape of the acoustic waves produced by the input transducer. Generally, the smaller the width of the electrodes, or the number of electrodes per wavelength, the higher the operating frequency. The amplitude of the surface acoustic waves at a particular frequency is determined by the constructive interference of the acoustic waves generated by the transducers.

The combined length of the transducers determines the length of the overall filter. To design a conventional SAW filter with ideal filter characteristics, the filter's impulse response needs to be very long. Because the length of the impulse response is directly proportional to the length of the transducer, the overall length of a conventional SAW filter having ideal characteristics would be too long to be useful in mobile phone communications systems.

Reflective SAW filters have been developed to satisfy this problem. Reflective SAW filters generally have at least one input transducer, one output transducer and one reflector formed on a piezoelectric substrate. The reflector is typically a reflective grating including spaced apart grid lines defining gaps therebetween. The acoustic waves received by the reflector from the input transducer are reflected by the grid lines within the grating so that the reflected waves constructively and destructively interfere with each other and the wave path is folded. Because of the folding, the length of the transducer is no longer dependent on the duration of the impulse response. Reflective SAW filters are, therefore, smaller in size and have high frequency selectivity, and thus are desirable for mobile phone communication systems.

The frequency response of a reflective SAW filter is further improved by weighting the individual reflectors to achieve a desired net reflectivity. Existing weighting methods include position-weighting, omission-weighting, and strip-width weighting. Other methods of weighting reflectors include changing the lengths of open-circuited reflective strips within an open-short reflector structure. Weighting the reflector improves the frequency response by reducing passband ripple and reducing sidelobe levels in the rejection band.

The above methods of weighting a reflector are all dependent upon the critical dimension of the reflector. The critical dimension of a reflector is the smallest reflector grid width or gap width, and is inversely proportional to the operating frequency of the filter. As the operating frequency increases, the critical dimension decreases. Fabrication constraints limit the critical dimension, thus limiting the operating frequency of the filter. As the operating frequency increases, most reflectors will have a limited dynamic range when implementing a wide range of reflectivity, which is required for filters with high selectivity. A reflective filter that is not as tightly constrained as current filters by its critical dimension would be advantageous.

An ideal frequency response for a reflective filter has a high frequency selectivity with steep transition edges, giving the response a good shape factor. If the critical dimension of a reflector were independent of the reflector strength, a wide range of reflectivity could be achieved that would produce a narrow bandwidth and steep transition edges.

What is needed is a reflector having a reflectivity function that is not as limited as today's SAW filters by the critical dimension of the structure, and that is able to operate with high reflectivity and with high frequency selectivity.

SUMMARY OF THE INVENTION

In accordance with the teachings of the present invention, a reflective grating for a SAW filter or resonator is disclosed that has a reflectivity function that is not as limited by the grating's critical dimension as today's SAW filters. The reflective grating includes a series of grid lines fabricated on a piezoelectric substrate that define gaps therebetween. The reflective grating is weighted by forming distributed acoustic reflective dots on the grid lines, or in the gaps between adjacent grid lines of the grating.

The grating reflectivity is determined in part by the disbursement of the reflective dots within the reflective grating. The reflective dot density and position transverse to the direction of wave propagation and the sequence of the reflective dots in the direction of wave propagation over a sampling period determines the grating reflectivity. Each sampling period is defined by M grid lines per each N wavelength ($\lambda$), where $\lambda$ is the wavelength at the center frequency, fo, of the filter, M and N are integers and M>N. $\lambda$ is defined as V/fo where V is the propagation velocity of the surface acoustic waves on the substrate. The reflective dot density and sequence may vary for each sampling period. It is the density and sequence of the reflective dots within the sampling period of N$\lambda$ that controls the magnitude and phase of the reflected waves. This can be further generalized to include non-uniform spacing of the grid lines in the direction of wave propagation.

Further areas of applicability of the present invention will become apparent from the detailed description provided hereinafter. It should be understood that the detailed description and specific examples, while indicating the specific embodiments of the invention, are intended for purposes of illustration only and are not intended to limit the scope of the invention.

DETAILED DESCRIPTION OF THE INVENTION

The following description of the embodiments of the invention directed to a weighted surface acoustic wave reflector for a SAW filter is merely exemplary in nature and is in no way intended to limit the invention, or its application or uses.

Figure 1:
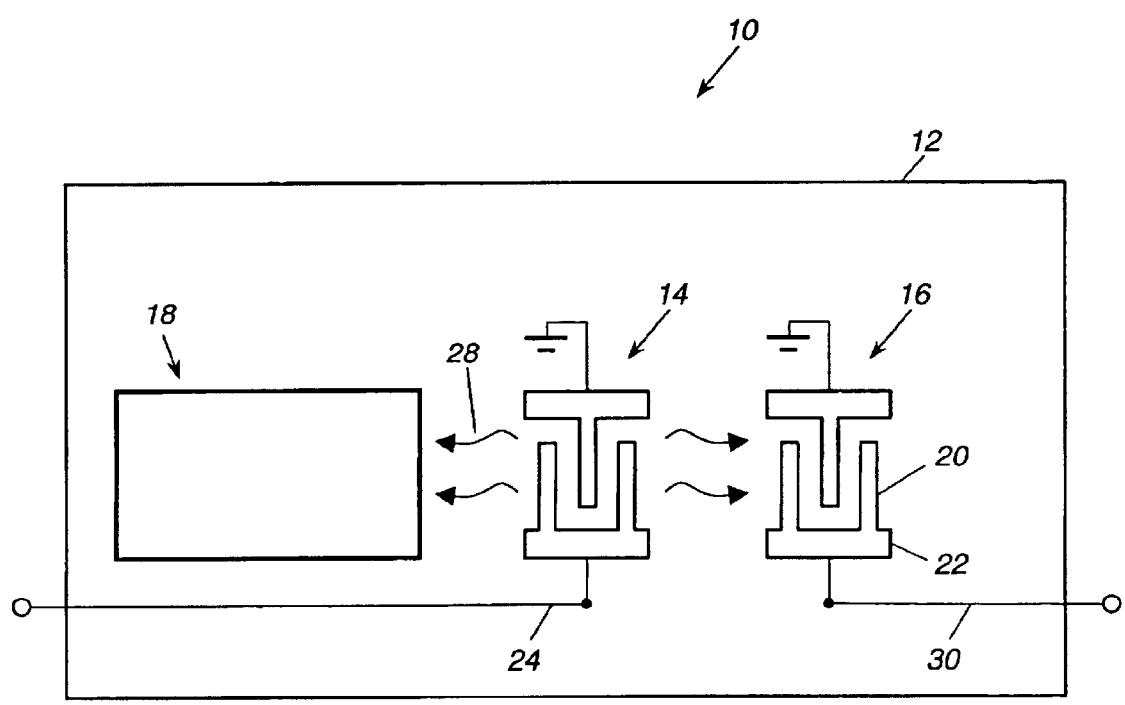
FIG. 1 is a top plan view of a reflective SAW filter including a SAW reflector, according to an embodiment of the present invention.

FIG. 1 is a top view of a reflective SAW filter 10 fabricated on a piezoelectric substrate 12, according to the teachings of the present invention. The reflective SAW filter 10 includes a bi-directional input interdigital transducer 14 (with SAW propagating equally in both directions), an output interdigital transducer 16, and a reflective grating 18, according to the invention. The input transducer 14 and the output transducer 16 include a plurality of uniformly spaced interdigital electrode fingers 20 coupled to end bus bars 22. The reflective SAW filter 10 is excited by an electrical input signal that is applied to the input transducer 14 on an input line 24. The input transducer 14 converts the electrical signal into surface acoustic waves 28 having a center frequency of interest that propagate outward from the input transducer 14 along the surface of the piezoelectric substrate 12.

Approximately half of the acoustic wave energy 28 is received by the output transducer 16 where it is converted back into electrical energy on an output line 30. The other half of the acoustic wave energy 28 is received by the reflective grating 18, and is reflected back through the input transducer 14 to the output transducer 16 where it is converted back into electrical energy. As will be discussed below, the reflective grating 18 employs reflective dots that optimize the reflectivity function of the reflective grating 18 for a particular frequency band.

It is noted that in order for the filter 10 to operate properly, a second reflective track should be included that also includes an input transducer, an output transducer and a reflective grating. The two input transducers would have the same polarity and the two output transducers would have opposite polarities. Thus, the surface acoustic waves that are directly received by the output transducer from the associated input transducer, and are not reflected by the reflective grating, are in phase with each other at the output transducer of the filter, and thus cancel because the two output transducers have opposite polarities. The acoustic waves that are reflected by the reflective gratings reach the associated output transducers 180° out of phase with each other, and therefore add at the output because the two output transducers have opposite polarities. The 180° phase difference between the grating reflections can be provided by several techniques, including providing a delay in one of the tracks relative to the other track where the reflected acoustic waves in the two tracks propagate a λ/2 difference in distance. This delay can be provided by an offset between the reflective gratings in the two tracks of λ/4.

Figure 2:
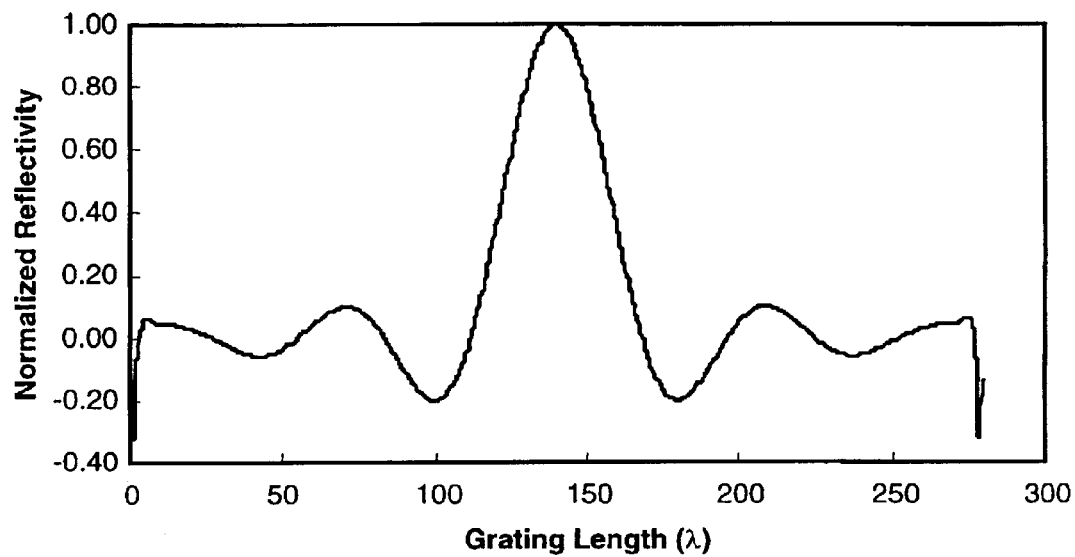
FIG. 2 a graphic representation of the reflectivity function for a reflective grating according to the present invention having a normalized $\lambda$/4 sampling period.

FIG. 2 is a graphical representation of the net reflectivity function of the reflective grating 18 having a λ/4 sampling period. The sampling period is defined by M grid lines per each N wavelength (Nλ/M), where λ is the wavelength at the center frequency of the filter bandwidth, M and N are integers and M>N. Examples of sampling periods include, but are not limited to, λ/4, λ/3, 2λ/5, 3λ/7, 3λ/8, 4λ/7 and 5λ/8. A characteristic of each sampling period is that the reflective grating 18 with no reflective dots has no net reflectivity for M>N. The desired net reflectivity is achieved by positioning the reflective dots within the reflective grating 18 according to a predetermined reflective dot density and reflective dot sequence. In one embodiment, the reflective grating 18 has approximately 275 sampling periods. The shape of the response is an ideal reflectivity function that will produce a filter with ideal characteristics.

Figure 3:
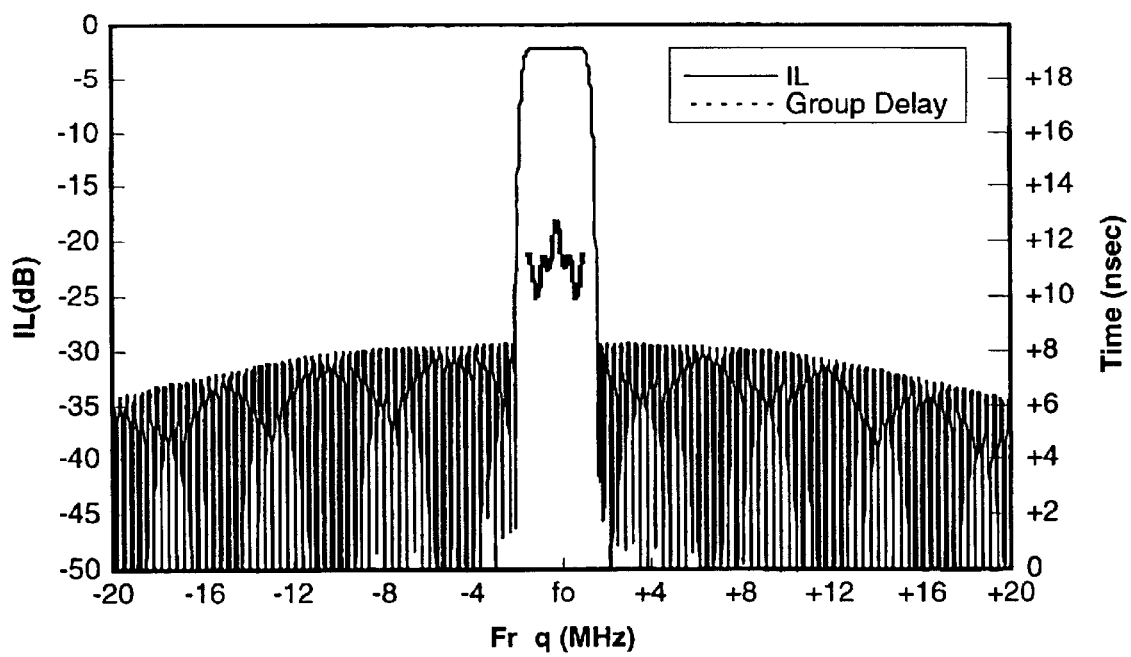
FIG. 3 is a graphical representation of the frequency response for a reflective grating according to the present invention having a normalized $\lambda$/4 sampling period.

FIG. 3 is a graphical representation of the frequency response for the reflective grating 18 having the reflective characteristics shown in FIG. 2. The graph shown in FIG. 3 illustrates what is known in the art as a "brick wall" frequency response. The brick wall frequency response is an ideal response that has steep transition edges and a narrow bandwidth. A reflective grating with the reflectivity function of FIG. 2 will produce the "brick wall" frequency response as shown in FIG. 3.

Figure 4:
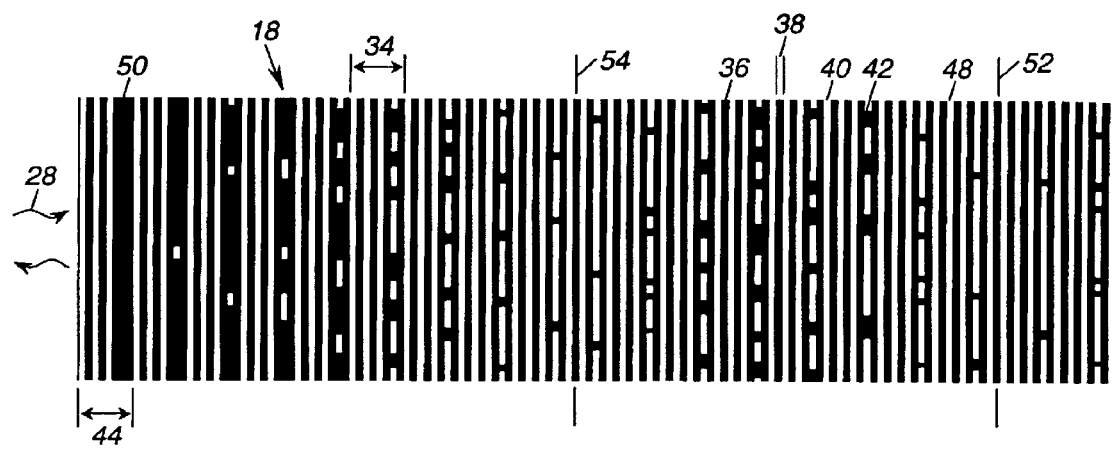
FIG. 4 is a top plan view of a weighted reflective grating having a λ/4 sampling period and a reflective dot sequence of (0,0,0,1) and (0,0,1,0)
Figure 5:
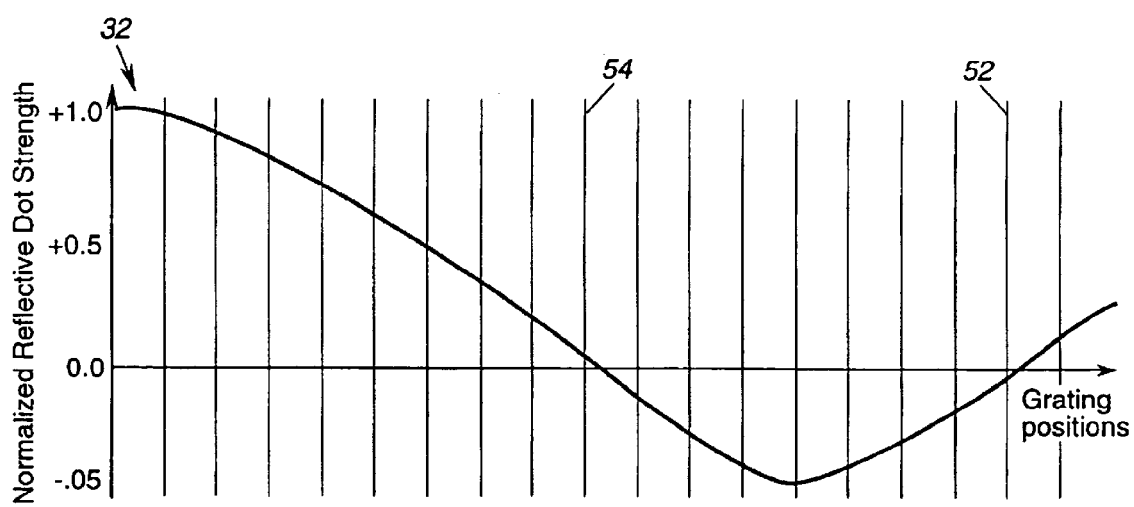
FIG. 5 is a graphical representation of the reflective dot strength for the reflective grating shown in FIG. 4.

FIG. 4 is a top plan view of the reflective grating 18 separated from the filter 10, according to the present invention. FIG. 5 is a graphical representation of the reflectivity function of the grating 18, where the vertical axis is the reflective dot strength and the horizontal axis is the position of the wave propagation direction in the grating 18. A sampling period 34 for the reflective grating 18 includes four grid lines. The vertical graph lines in FIG. 5 align with specific locations along the wave propagation direction of the grating 18, where each graph line shows a separation between sampling periods 34. The reflective grating 18 includes spaced apart grid lines 36 each having a width 38 equal to λ/8. A gap 40 is provided between each grid line 36 equal to the width of the adjacent grid line 38.

Reflective dots 42 are distributed into the gaps 40 between adjacent grid lines 36 according to a predetermined dot sequence and density throughout the reflective grating 18. The reflective dot sequence and density sets the phase and magnitude of the reflected acoustic wave. Some portions of the reflective grating 18 includes grid lines 36 that are uniformly spaced and other portions of the reflective grating 18 may include grid lines 36 that are not uniformly spaced. The spacing of the grid lines 36 is determined by the reflective dots 42 in that the sampling periods 34 with more dots 42 have a lower propagation velocity than that of the sampling periods 34 with less dots 42. Thus, a slight adjustment of the wavelengths for different periods is required for the waves to propagate properly.

As will be discussed in more detail below, the grating 18 has a dot sequence (0, 0, 0, 1) and a dot sequence (0, 0, 1, 0). The numbers 0 and 1 refer to the density of the reflective dots 42 within sampling period 34 and 44. The dot densities range from 0, which refers to no reflective dots 48, to 1, which refers to a solid reflective dot that fills an entire gap 50 within the sampling period 44.

By varying the dot density within each sampling period 34, the reflective dot strength and, hence, the net reflectivity of the period 34 changes. For example, referring to the sampling period 34 for the reflective grating 18, the dot strength in the fourth gap corresponds to a dot density of approximately 0.5, which equates to a gap 40 that is approximately 50% filled with reflective dots 42. For each sampling period 34, there is a corresponding reflective dot strength as depicted by the graph in FIG. 5. The phase of the reflectivity function is changed by adjusting the dot sequence of the sampling periods 34 to the right side of a reference line 54. The dot sequence is (0,0,0,1) for the sampling periods 34 on the left side of reference line 54, and the dot sequence is (0,0,1,0) for the sampling periods 34 between reference lines 54 and 52. The reflectivity of the grid lines 36 to the left of the line 54 is 180° out of phase to the reflectivity of the grid lines 36 between the lines 54 and 52. The same reflectivity function can be replicated, according to the present invention, by varying either the sampling period 34 or the reflective dot sequence, or both.

Figure 6:
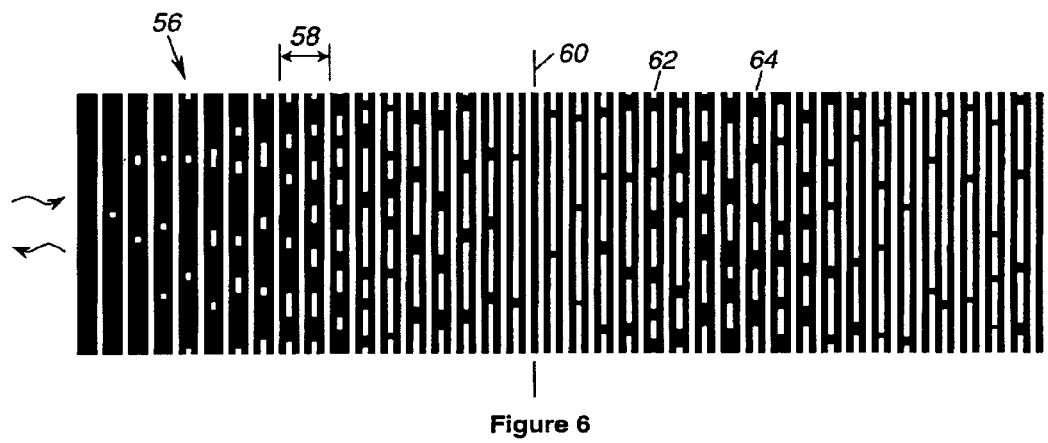
FIG. 6 is a top plan view of a weighted reflective grating with a λ/4 sampling period and a reflective dot sequence of (1,0,1,0) and (0,1,0,1)
Figure 7:
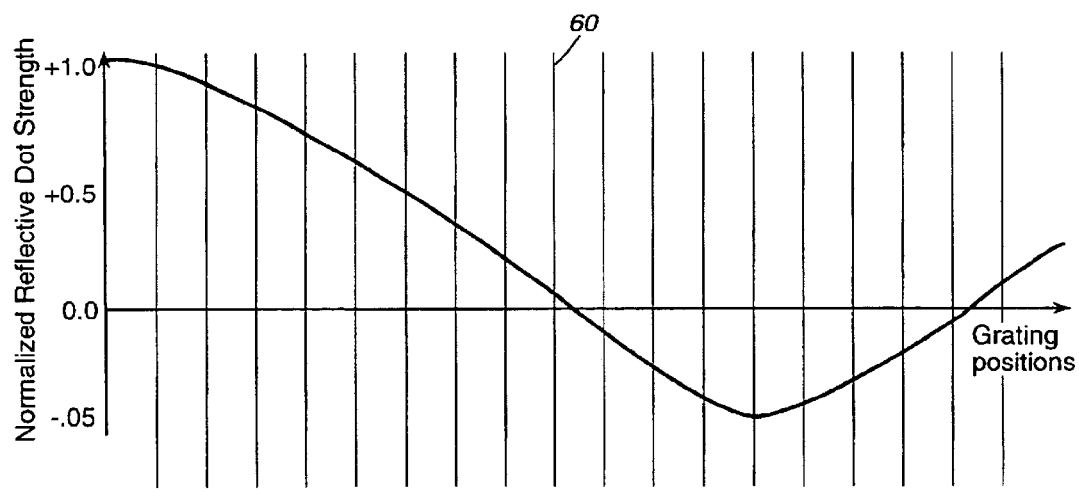
FIG. 7 is a graphical representation of the reflective dot strength for the reflective grating shown in FIG. 6.

FIG. 6 shows a reflective grating 56 depicting another way to implement the reflectivity function shown in FIG. 5 using the same λ/4 sampling period, but with a different reflective dot sequence. FIG. 7 graphically represents the reflectivity function of the reflective grating 56, where the vertical axis is the reflective dot strength and the horizontal axis is the position on the reflective grating 56. The reflective grating 56 can replace the reflective grating 18 in the filter 10. The reflective grating 56 differs from the reflecting grating 18 by having reflective dots 62 in the first and third gaps of a sampling period 58, so that the phase is changed by adjusting the dot sequence. A 180° phase shift takes place at reference line 60 where a new dot sequence starts. In this sequence the second and fourth gaps are filled with the reflective dots 62. The dots 62 are randomly distributed within each gap 64, but they are always filled according to the dot density.

Figure 8:
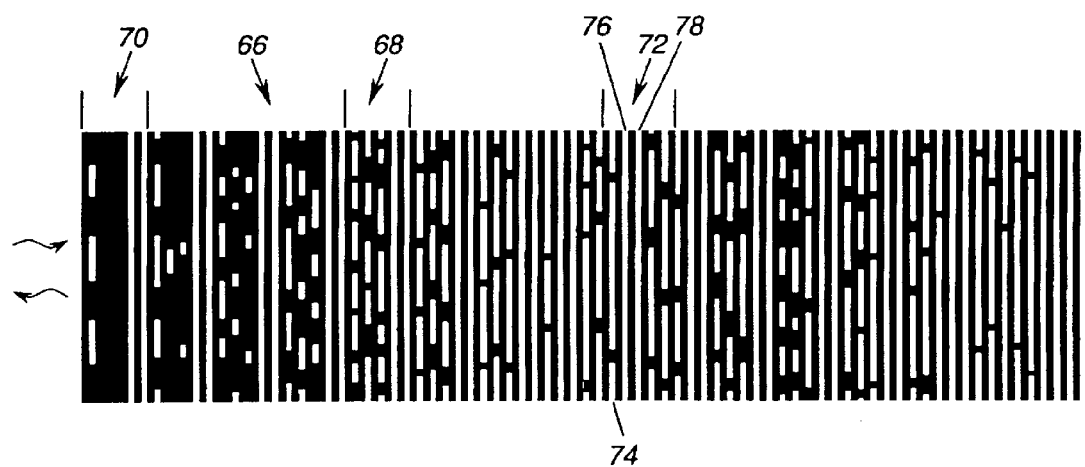
FIG. 8 is a top plan view of a weighted reflective grating with a 3λ/5 sampling period and a reflective dot sequence of (0.5,1,1,0,0) and (0.5,0,0,1,1)
Figure 9:
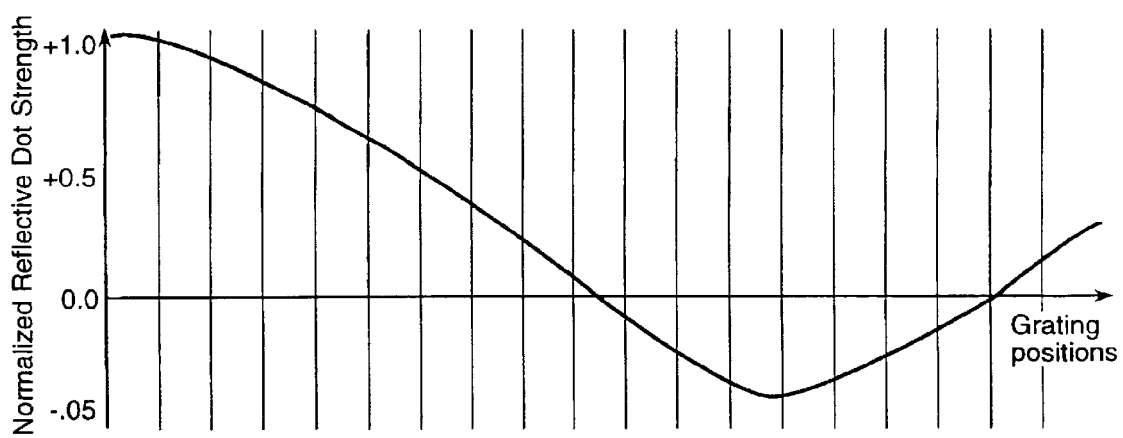
FIG. 9 is a graphical representation of the reflective dot strength for the reflective grating shown in FIG. 8.

FIG. 8 shows a reflective grating 66 depicting another way to implement the same reflectivity function that is provided by the reflective gratings 18 and 56 shown in the previous figures using a different sampling period and reflective dot sequence. FIG. 9 shows the reflectivity function for the reflective grating 66. For the reflective grating 66, a sampling period 68 includes five grid lines per three wavelengths (3λ/5). The reflective dots are randomly distributed within the gaps according to dot sequences (0.5, 1, 1, 0, 0) 70 and (0.5, 0, 0, 1,1) 72. The key to this particular set of dot sequences is the relationship between the dot density in a first gap 74 to the dot densities in a second gap 76 and a third gap 78. For example, the dot density in the first gap is 0.5, which is relative to the dot density in the second gap 76, which is 1. This means that if the first gap 74 is filled approximately 50% with reflective dots, the second gap 76 and the third gap 78 must be filled approximately 100% with reflective dots.

Further, if the first gap 74 has a dot density of 0.25, the second gap 76 and the third gap 78 must have a dot density of 0.50. The dot densities for each gap are proportionally related to one another. The purpose of only approximately 50% of the first gap 74 being filled with dots and approximately 100% of the second gap 76 and the third gap 78 being filled with dots is to insure that the first gap 74 has approximately one-half the reflectivity of the second gap 76 or the third gap 78.

Figure 10:
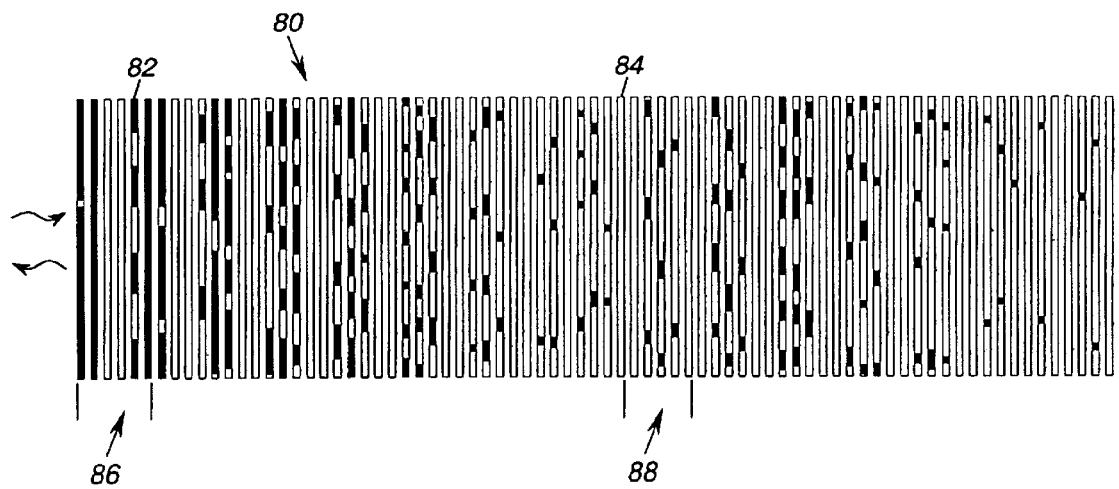
FIG. 10 is a top plan view of a reflective grating where the reflective acoustic dots are placed on the grid lines of the reflective grating.
Figure 11:
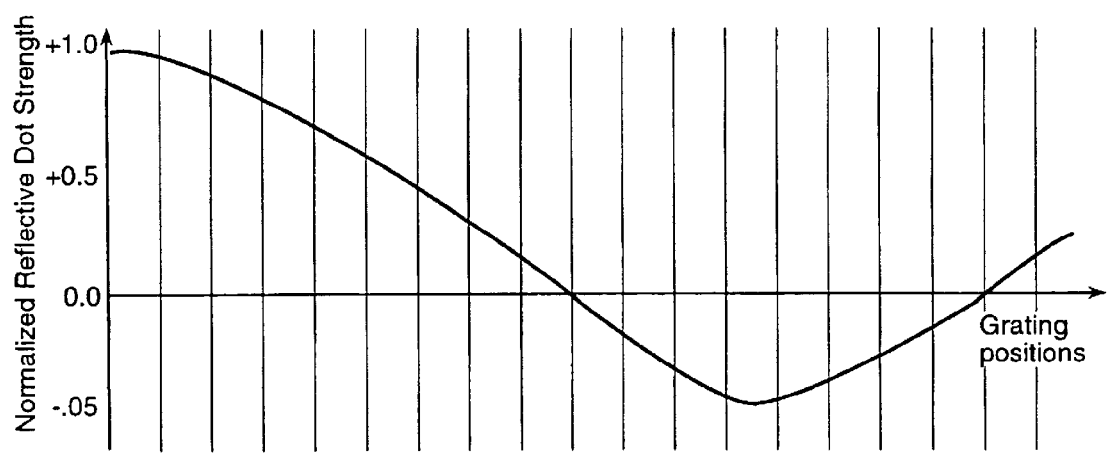
FIG. 11 is a graphical representation of the reflective dot strength for the reflective grating shown in FIG. 10.

FIG. 10 is a top view of a reflective grating 80 depicting an additional embodiment, according to the present invention, that uses distributed acoustic reflective dots randomly distributed on top of the grid lines. FIG. 11 shows the reflectivity function for the reflective grating 80. The sampling period for the reflective grating 80 is 3λ/5, which is five grid lines per three wavelengths. Reflective dots 82 are distributed on grid lines 84 according to dot sequence (1, 0, 0, 0.5, 1) 86 and (0, 1, 1, 0.5, 0) 88.

Figure 12A:
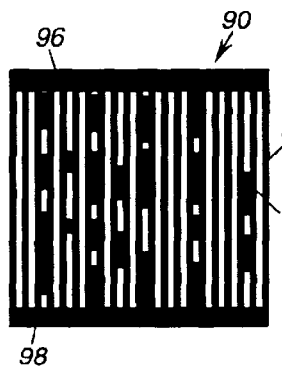
FIGS. 12(a)–12(g) are top views of several reflective gratings having different grating line and reflective dot configurations and materials, according to the present invention.

The dot pattern and reflective grating grid lines of the various embodiments discussed above can be formed in the piezoelectric substrate 12 in various ways. FIGS. 12(a)–12(g) depict various embodiments of reflective gratings of the invention to show this feature. Particularly, FIG. 12(a) shows a reflective grating 90 including grid lines 92 and reflective dots 94, where the grid lines 92 and the dots 94 are deposited and patterned metal on the substrate. In this embodiment, the grid lines 92 are short circuited by opposing end bus bars 96 and 98.

Figure 12B:
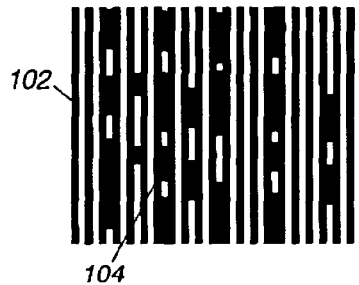

FIG. 12(b) shows a reflective grating 100 including uniform grid lines 102 and reflective dots 104 made of the same material, where the grid lines 102 are open circuited, i.e., no end bus bars. The material can be metal or any substance deposited and patterned on the substrate, an etched groove below the substrate, ion implantations into the substrate, or any kind of disturbance on the substrate that provides the desired pattern.

Figure 12C:
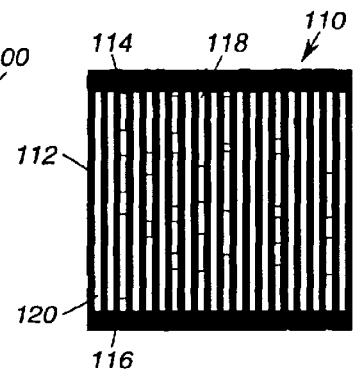

FIG. 12(c) shows a reflective grating 110 including uniform grid lines 112 short circuited by opposing end bus bars 114 and 116, where the grid lines 112 and the end bars 114 and 116 are metal deposited on the substrate. A series of reflective dots 118 are formed within gaps 120 between the grid lines 112, where the reflective dots 118 can be any substance other than that of the deposited metal for the grid lines 112 and the end bus bars 114 and 116. For example, the reflective dots 118 can be etched grooves below the substrate, ion implantations into the substrate, or any kind of disturbance on the substrate having the defined pattern.

Figure 12D:
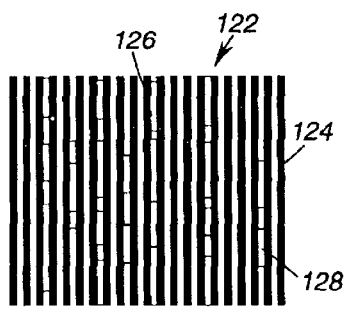

FIG. 12(d) shows a reflective grating 122 including grid lines 124 and reflective dots 126 positioned within gaps 128 between the grid lines 124. This embodiment depicts the same embodiment as shown in FIG. 12(c), but where the grid lines 124 are open circuited, i.e., the end bus bars 114 and 116 have been removed.

Figure 12E:
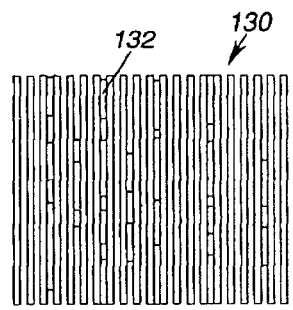

FIG. 12(e) shows a reflective grating 130 including grid lines 132 that are imaginary. Reflective dots 132 are positioned between the imaginary grid lines 132 and can be any of the materials identified in the embodiments herein.

Figure 12F:
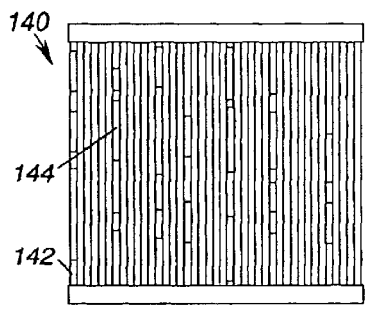

FIG. 12(f) shows a reflective grating 140 including grid lines 142, where reflective dots 144 are positioned on the grid lines 142 as shown. The grating 140 includes end bus bars 146 and 148 that can be removed in an open circuit embodiment. The reflective dots 144 can be implemented in any number of suitable ways. For example, if the grid lines 142 are metal, the dots 144 can be the same or a different metal deposited on top of the grid lines 142. Further, the dots 144 can be pre-etched on the substrate, and metal grid lines can then be deposited on top of the dots 144. Also, the complete grid pattern, except for the reflective dot area, can be etched below the substrate surface. Additionally, a complete grid can be etched below the substrate surface, and the reflective dots 142 can be deposited and patterned metal, or any kind of material that causes a disturbance of surface acoustic waves.

Figure 12G:
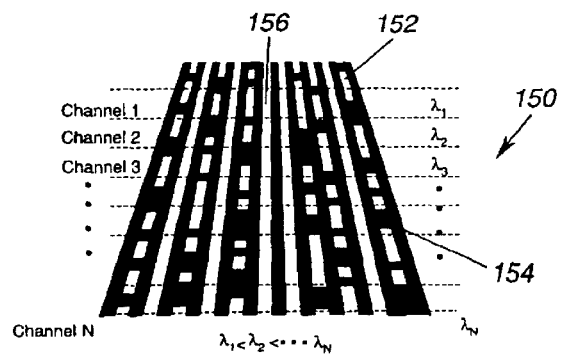

FIG. 12(g) shows a reflective grating 150 that is tapered to support a plurality of adjacent channels operating at different frequencies. The reflective grating 150 includes grid lines 152 having reflective dots 154 within gaps 156 between the grid lines 152. The tapered grating 150 can be constructed by connecting N channels of gratings from top to bottom in ascending or descending order relative to the wavelengths of the channels. The various embodiments of the reflective gratings depicted in FIGS. 12(a)-12(f) can also be applied to the tapered reflective grating 150.

It should be clear from the above description that there are many different combinations of sampling rates and reflective dot densities and dot sequences that can be used to accomplish the desired filter response. For a given sampling rate, the relative reflectivity strengths and reflectivity phases between different sampling periods can be adjusted by changing the values in the respective dot sequences. The reflectivity function for these reflectors is not dependent upon the critical dimension of the reflector; therefore, the operating frequency or the grating reflectivity is not limited as it is in conventional reflector filters.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A reflector for reflecting surface acoustic waves, said reflector comprising:

a substrate;

a grid including a plurality of spaced apart grid lines disposed on the substrate where the grid lines define spaces therebetween; and a plurality of acoustic reflective dots distributed within the grid and having a predetermined density and sequence to control the magnitude and phase of the reflected surface acoustic waves, wherein the density and sequence of the reflective dots define a predetermined sampling period and determine the reflectivity of the reflector, and wherein at least one space between adjacent grid lines in a sampling period of grid lines includes no reflective dots.

2. The reflector of claim 1 wherein the density of the reflective dots range from 0 to 1, where 0 is no dots and 1 is all dots.

3. The reflector of claim 1 wherein the density and sequence of the dots changes the phase of the reflected acoustic waves by any arbitrary number of degrees.

4. The reflector of claim 1 wherein the reflector is part of a SAW filter.

5. The reflector of claim 1 wherein the sampling period is determined by M grid lines per N wavelengths of the surface waves ($N\lambda/M$), where $\lambda$ is the wavelength of the center frequency of a frequency band of interest, M and N are integers and M>N.

6. The reflector of claim 1 wherein the reflective dots are disposed on the grid lines.

7. The reflector of claim 1 wherein the reflective dots are disposed between the grid lines.

8. The reflector of claim 1 wherein ends of the grid lines are open circuited.

9. The reflector of claim 1 further comprising first and second bus bars electrically coupled to opposing ends of the grid lines so that the grid lines are short circuited.

10. The reflector of claim 1 wherein the grid lines are formed by the group consisting of patterned metal on the substrate, etched grooves below the substrate, ion implantations into the substrate, a patterned substance other than metal deposited on the substrate, imaginary grid lines, and a disturbance on the substrate that affects the acoustic waves.

11. The reflector of claim 1 wherein the reflective dots are formed by the group consisting of patterned metal on the substrate, etched grooves below the substrate, ion implantations into the substrate, a patterned substance other than metal deposited on the substrate, and a disturbance on the substrate that affects the acoustic waves.

12. The reflector of claim 1 wherein the grid lines and the reflective dots are different materials.

13. The reflector of claim 1 wherein the grid is a tapered grid to support a plurality of adjacent frequency channels having different wavelengths.

14. The reflector of claim 1 wherein the substrate is a piezoelectric substrate.

15. The reflector of claim 1 wherein the grid lines are either uniformly or non-uniformly spaced apart.

16. A reflector for reflecting surface acoustic waves, said reflector comprising:

a piezoelectric substrate;

a grating structure disposed on the substrate, said grating structure including spaced apart grid lines, said grid lines defining gaps therebetween, said gaps being either uniformly or non-uniformly spaced; and a plurality of acoustic reflective dots distributed within the gaps and/or on the grid lines, said reflective dots having a predetermined density and sequence that determines the net reflectivity of the grating structure and controls the magnitude and phase of the reflected surface acoustic waves, wherein the dot distribution has a predetermined sampling period, said sampling period being defined by M grid lines per each N wavelength ($N\lambda/M$) of the surface acoustic waves, where $\lambda$ is the wavelength of the center frequency of a frequency band of interest, M and N are integers and M>N, and wherein at least one space between adjacent grid lines in a sampling period of grid lines includes no reflective dots.

17. The reflector of claim 16 wherein the grating structure is a tapered grid to support a plurality of frequency channels having different wavelengths.

18. The reflector of claim 16 wherein the density of the dot distribution ranges from 0 to 1, where 0 is no dots and 1 is all dots.

19. The reflector of claim 16 wherein the density and sequence of the dots changes the phase of the reflected acoustic wave by any arbitrary number of degrees.

20. The reflector of claim 16 wherein the ends of the grid lines are open circuited.

21. The reflector of claim 16 further comprising first and second bus bars electrically coupled to opposing ends of the grid lines so that the grid lines are short circuited.

22. The reflector of claim 16 wherein the grid lines are formed by the group consisting of patterned metal on the substrate, etched grooves below the substrate, ion implantations into the substrate, a patterned substance deposited on the substrate, imaginary grid lines, and a disturbance on the substrate that affects the acoustic waves.

23. The reflector of claim 16 wherein the reflective dots are formed by the group consisting of patterned metal on the substrate, etched grooves below the substrate, ion implantations into the substrate, a patterned substance deposited on the substrate, and a disturbance on the substrate that affects the acoustic waves.

24. The reflector of claim 16 wherein the grid lines and the reflective dots are different materials.

25. A SAW filter for filtering a signal, said filter comprising:

a piezoelectric substrate;

at least one input transducer disposed on the substrate, said input transducer being responsive to the input signal and generating surface acoustic waves propagating on the piezoelectric substrate in response to the signal;

at least one reflective grating disposed on the substrate for reflecting the acoustic waves from the at least one input transducer, said grating including spaced apart grid lines defining gaps therebetween, said grating further including distributed acoustic reflective dots disposed relative to the grid lines in a predetermined manner, wherein a density and sequence of the distributed acoustic reflective dots define a sampling period and controls the magnitude and phase of the reflected acoustic waves, and wherein at least one space between adjacent grid lines in a sampling period of grid lines includes no reflective dots; and at least one output transducer disposed on the substrate, said output transducer being responsive to the reflected acoustic waves from the reflective grating, said at least one output transducer converting the acoustic waves into electrical energy.

26. The reflector of claim 25 wherein the grid lines and reflective dots are formed by one or more of the group consisting of patterned metal on the substrate, etched grooves below the substrate, ion implantations into the substrate, a patterned substance other than metal deposited on the substrate, imaginary grid lines, and a disturbance on the substrate that affects the acoustic waves.

27. The filter of claim 25 wherein the distributed acoustic reflective dots are placed on the grid lines and/or in the gaps between grid lines.

28. The filter of claim 25 wherein a the sampling period of the distributed acoustic dots is defined by M grid lines per N wavelengths (N$\lambda$/M) of the surface acoustic waves, where $\lambda$ is the wavelength of the center frequency of a frequency band of interest, M and N are integers and M>N.

29. The reflector of claim 25 wherein the density of the dot distribution ranges from 0 to 1, where 0 is no dots and 1 is all dots.

* * * * *